(12) United States Patent
Hidri et al.

(10) Patent No.: US 7,136,000 B1
(45) Date of Patent: Nov. 14, 2006

(54) SELECTIVE OFFSET ADJUSTMENT OF A TRACK AND HOLD CIRCUIT

(75) Inventors: Ols Hidri, Munich (DE); Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/156,057

(22) Filed: Jun. 17, 2005

(51) Int. Cl.
*H03M 1/00* (2006.01)

(52) U.S. Cl. ............................. 341/122; 341/172

(58) Field of Classification Search .............. 341/150, 341/122, 123, 124, 118, 120, 155, 172; 327/91, 327/94, 95; 330/9
See application file for complete search history.

(56) References Cited

U.S. PATENT DOCUMENTS

| | | | | |
|---|---|---|---|---|
| 4,439,693 | A * | 3/1984 | Lucas et al. ................. | 327/95 |
| 4,542,304 | A * | 9/1985 | Swanson ...................... | 327/95 |
| 4,587,443 | A * | 5/1986 | van de Plassche ............ | 327/95 |
| 4,779,012 | A * | 10/1988 | Moscovici .................... | 327/95 |
| 5,184,127 | A * | 2/1993 | Myers ......................... | 341/122 |
| 5,440,256 | A * | 8/1995 | Erhart et al. .................. | 327/94 |
| 5,734,276 | A * | 3/1998 | Abdi et al. .................... | 327/94 |
| 6,016,067 | A * | 1/2000 | Vulih et al. ................... | 327/94 |
| 6,028,459 | A * | 2/2000 | Birdsall et al. ............... | 327/94 |
| 6,052,000 | A * | 4/2000 | Nagaraj ....................... | 327/94 |
| 6,384,641 | B1 * | 5/2002 | Kase ........................... | 327/91 |
| 6,753,727 | B1 * | 6/2004 | Magoon et al. ............... | 330/9 |
| 6,954,168 | B1 * | 10/2005 | Hoskins ...................... | 341/155 |
| 2005/0207234 | A1 * | 9/2005 | Baechtold et al. | |

OTHER PUBLICATIONS

Rudy J. Van De Plassche et al., "A High-Speed 7 Bit A/D Converter," *IEEE*, Dec. 1979 (6 pgs), no date.
Kevin Kattmann et al., "A Technique for Reducing Differential Non-Linearity Errors in Flash A/D Converters," *IEEE*, Feb. 14, 1991 (2 pgs).
Klaas Bult et al., "An Embedded 240-mW 10-b 50-MS/s CMOS ADC in 1-mm$^2$", *IEEE*, Dec. 1997 (9 pgs), no date.
Opris et al., "A Single-Ended 12b 20MSample/s Self-Calibrating Pipeline A/D Converter," *ISSCC*, Feb. 6, 1998 (3 pgs).
D. Fu et al., "Digital Background Calibration of a 10b 40MSample/s Parallel Pipelined ADC," *ISSCC*, Feb. 6, 1998 (3 pgs).
K. Dyer et al., "Analog Background Calibration of a 10b 40MSample/s Parallel Pipelined ADC," *ISSCC*, Feb. 6, 1998 (3 pgs).

(Continued)

*Primary Examiner*—Jean Bruner Jeanglaude
(74) *Attorney, Agent, or Firm*—Brett A. Hertzberg; Merchant & Gould PC

(57) ABSTRACT

A track/hold circuit with an offset adjustment that can be used to compensate for offset errors from other parts of the system containing the track/hold circuit. The offset adjustment may be provided by impressing a voltage at an electrode of a capacitor of the track/hold circuit during a hold mode and not impressing the voltage at the capacitor electrode during the track mode. The offset adjustment signal may be generated using an adjustable current source to propagate a current through a resistance that is coupled to the track/hold circuit output node via a capacitor of a voltage capacitive divider circuit during the hold mode. The offset introduced into the track/hold mode output signal can be independent of the voltage stored in the voltage capacitive divider circuit just prior to adding the offset adjustment signal.

20 Claims, 5 Drawing Sheets

OTHER PUBLICATIONS

William Ellersick et al., "GAD: A 12-GS/s CMOS 4-bit A/D Converter for an Equalized Multi-Level Link," *Symposium on VLSI Circuits Digest of Technical Papers*, 1999 (4 pgs), no month.

Jun Ming et al., "An 8b 80MSample/s Pipelined ADC with Background Calibration," *IEEE*, Feb. 7, 2000 (3 pgs).

Kouji Sushihara et al., "A 6b 800MSample/s CMOS A/D Converter," *IEEE*, Feb. 9, 2000 (2 pgs).

Krishnaswamy Nagaraj et al., "A Dual-Mode 700-Msamples/s 6-bit 200-Msample/s 7-bit A/D Converter in a 0.25-μm Digital CMOS Process," *IEEE*, Dec. 2000 (9 pgs), no date.

Govert Geelen, "A 6b 1.1 GSample/s CMOS A/D Converter," *IEEE*, Feb. 6, 2001 (3 pgs).

Robert C. Taft et al., "A 100-MS/s 8-b CMOS Subranging ADC with Sustained Parametric Performance from 3.8 V Down to 2.2 V," *IEEE*, Mar. 2001 (8 pgs), no date.

Naoki Kurosawa et al., "Explicit Analysis of Channel Mismatch Effects in Time-Interleaved ADC Systems," *IEEE*, Mar. 2001 (11 pgs), no date.

Peter Scholtens et al., "A 6b 1.6GSample/s Flash ADC in 0.18μm CMOS using Averaging Termination," *ISSCC*, Feb. 5, 2002 (3 pgs).

Ken Poulton et al., "A 4GSample/s 8b ADC in 0.35μm CMOS," *ISSCC*, Feb. 5, 2002 (3 pgs).

Po-Hui Yang et al., "Low-Voltage Pulsewidth Control Loops for SOC Applications," *IEEE*, Oct. 2002 (4 pgs), no date.

Shafiq M. Jamal et al., "A 10-b 120-Msample/s Time-Interleaved Analog-to-Digital Converter With Digital Background Calibration," *IEEE*, Dec. 2002 (10 pgs), no date.

Ken Poulton et al., "A 20GS/s 8b ADC with a 1MB Memory in 0.18μm CMOS," *IEEE*, 2003 (10 pgs), no month.

Xicheng Jiang et al., "A 2GS/s 6b ADC in 0.18μm CMOS," *IEEE*, Feb. 12, 2003 (10 pgs).

Robert Taft et al., "A 1.8V 1.6GS/s 8b Self-Calibrating Folding ADC with 7.26 ENOB at Nyquist Frequency," *IEEE*, Feb. 17, 2004 (2 pgs).

Robert C. Taft et al., "A 1.8-V 1.6-GSample/s 8-b Self-Calibrating Folding ADC With 7.26 ENOB at Nyquist Frequency," *IEEE*, Dec. 2004 (9 pgs), no date.

Ozan E. Erdogan et al., "A 12b Digital-Background-Calibrated Algorithmic ADC with −90dB THD," *IEEE*, Feb. 17, 1999 (3 pgs).

Michael Choi et al., "A 6b 1.3GSample/s A/D Converter in 0.35μm CMOS," *ISSCC*, Feb. 6, 2001 (3 pgs).

\* cited by examiner

SELECTIVE OFFSET ADJUSTMENT OF A TRACK AND HOLD CIRCUIT

BACKGROUND

Analog-to-digital (ADC) circuits are often used in systems having a sensor (e.g., a transducer, receiver, etc.) that outputs an analog electrical signal having a current or voltage that is some function of a property of the sensed signal. The signal path containing the ADC may have other components (e.g., amplifiers, attenuators, buffers, etc.) that can introduce offset errors. In some approaches, each component in the signal path is carefully designed to minimize the offset error it introduces, which can be difficult and complex especially for high-speed components.

BRIEF DESCRIPTION OF THE DRAWINGS

Non-limiting and non-exhaustive embodiments are described with reference to the following figures, wherein like reference numerals refer to like parts throughout the various views unless otherwise specified.

DETAILED DESCRIPTION

Various embodiments are described more fully below with reference to the accompanying drawings, which form a part hereof, and which show specific exemplary embodiments for practicing the invention. However, embodiments may be implemented in many different forms and should not be construed as limited to the embodiments set forth herein; rather, these embodiments are provided so that this disclosure will be thorough and complete, and will fully convey the scope of the invention to those skilled in the art. Embodiments may be practiced as methods, systems or devices. The following detailed description is, therefore, not to be taken in a limiting sense.

Figure 1:
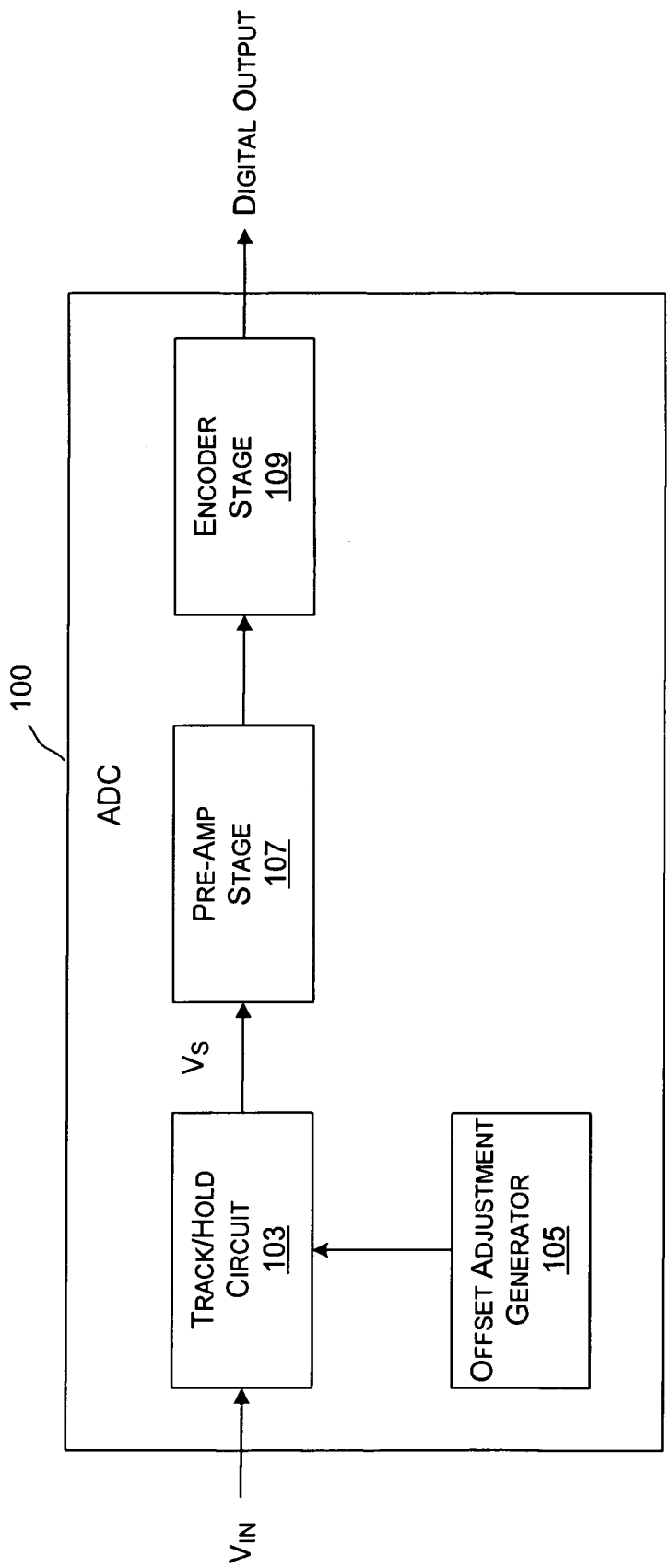
FIG. 1 is a simplified block diagram illustrating an exemplary ADC with offset adjustment, according to one embodiment.

FIG. 1 illustrates a portion of an exemplary ADC 100 with offset adjustment, according to one embodiment. In this embodiment, ADC 100 includes a track/hold circuit 103, an offset adjustment generator 105, a pre-amp stage 107 and an encoder stage 109. In this illustrated embodiment, ADC 100 is a non-interleaved ADC, but in other embodiments, ADC 100 can be an interleaved ADC. In some embodiments, track/hold circuit 103, pre-amp stage 107 and encoder stage 109 are implemented using suitable conventional track/hold, pre-amp stage, and encoder stage circuits. However, in accordance with embodiments of the present invention, ADC 100 includes offset adjustment generator 105, unlike conventional ADCs.

In this embodiment, track/hold circuit 103 is connected to receive an analog input voltage signal $V_{IN}$. In this illustrated embodiment, signal $V_{IN}$ is a single ended signal, but in other embodiments signal $V_{IN}$ can be a differential signal. Track/hold circuit 103 is also connected to receive an offset adjustment signal from offset adjustment generator 105. Pre-amp stage 107 is connected to receive an output signal from track/hold circuit 103. Pre-amp stage 107 is also connected to provide an output signal to encoder stage 109, which is configured to output digital signals representing samples of the input signal $V_{IN}$.

In operation, this embodiment of track/hold circuit 103 receives signal $V_{IN}$ and outputs a signal $V_S$ to pre-amp stage 107. During a track mode, the voltage level of signal $V_S$ "tracks" or follows the voltage level of signal $V_{IN}$. This tracking operation is similar to tracking operations of conventional track/hold circuits.

However, during a hold mode, the voltage level of signal $V_S$ is, ideally, held at a voltage level representing the voltage level of signal $V_{IN}$ at the instant the mode transitioned from track mode to hold mode, plus the offset adjustment signal received from offset adjustment generator 105. That is, offset adjustment generator 105 introduces a preselected voltage offset to the output signal of track/hold circuit 103. In some embodiments, the voltage level of the offset adjustment signal is determined by the user during a calibration process to compensate for offset(s) generated by other component(s) in ADC 100 (e.g., circuitry in pre-amp stage 107 and/or encoder stage 109). In some embodiments, the offset adjustment signal may also be determined to compensate for offset(s) generated by other components (outside of ADC 100) in the signal path from the sensor/transducer to ADC 100.

The use of offset adjustment generator such as offset adjustment generator 105 in an ADC can advantageously simplify the design of amplifiers and/or other components in the signal path by placing the offset compensation circuitry in the ADC. In addition, by performing the offset adjustment in the ADC, the offset adjustment is being performed on a DC signal (i.e., during the hold mode, signal $V_S$ is a constant voltage signal), which is less complex, for example, than performing the offset compensation at the input port of an amplifier which is designed for receiving relatively high frequency signals.

Pre-amp stage 107 and encoder stage 109 receive signal $V_S$ from track/hold circuit 103 and, during the hold mode, operate to output a digital signal representing the voltage level of signal $V_S$ (i.e., the sampled value of signal $V_{IN}$ plus the offset adjustment signal from offset adjustment generator 105). Any suitable pre-amp stage and encoder stage may be used to implement pre-amp stage 107 and encoder stage 109.

Figure 2:
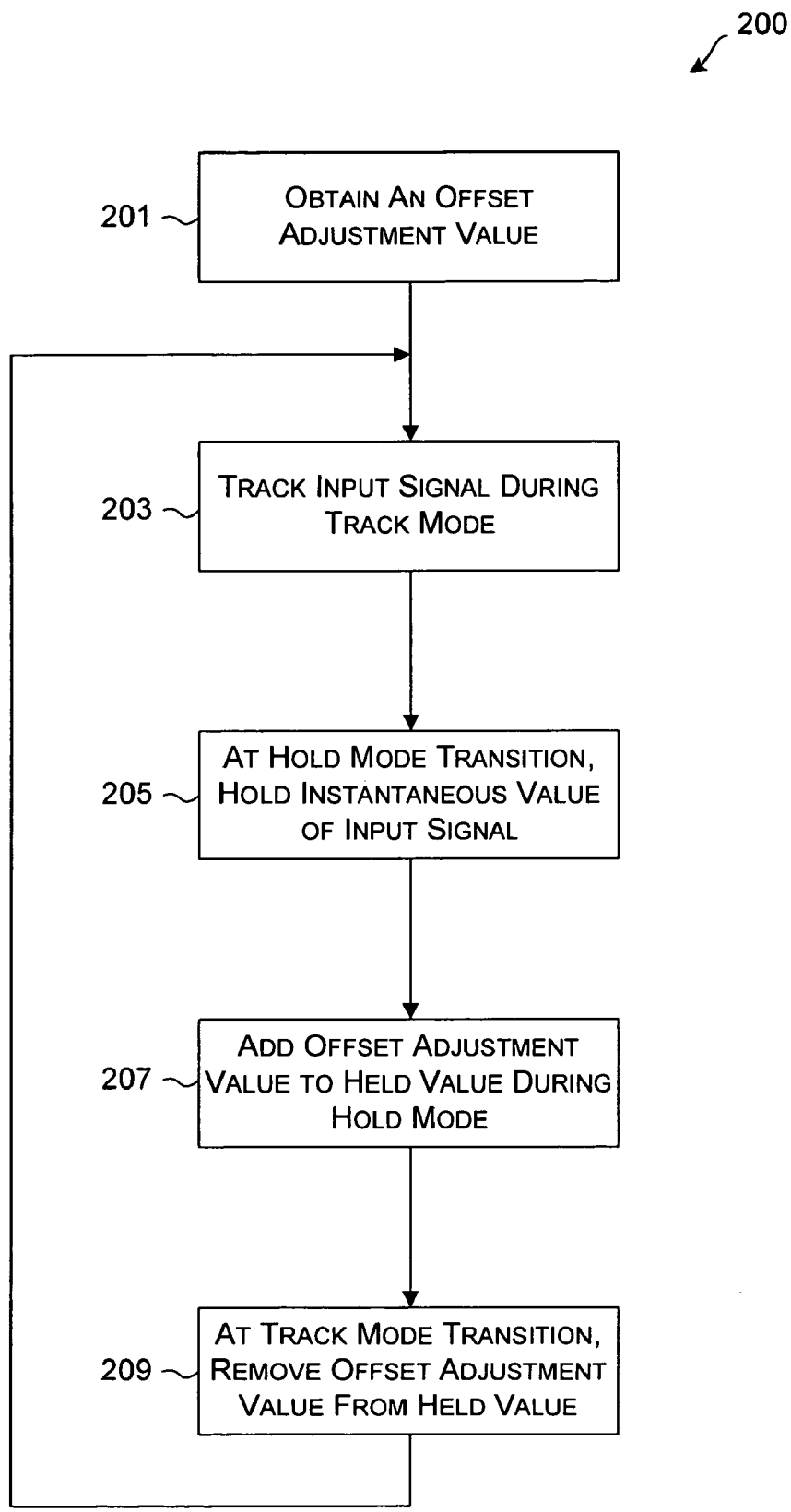
FIG. 2 is a flow diagram illustrating exemplary operational flow in introducing an adjustable offset in an ADC, according to one embodiment.

FIG. 2 illustrates an operational flow 200 for introducing an adjustable offset in an ADC, according to one embodiment. Operational flow 200 may be performed in any suitable environment or circuitry. For example, operational flow 200 may be executed by an ADC such as ADC 100 (FIG. 1). In another example embodiment, operational flow 200 may be performed by each track/hold subunit of an interleaving ADC. Therefore, the description of operational flow 200 may refer to at least one of the components of FIG. 1. However, any such reference to components of FIG. 1 is for descriptive purposes only, and it is to be understood that the implementations of FIG. 1 are a non-limiting environment for operational flow 200.

At a block 201, an offset adjustment value for use in an ADC is obtained. In one embodiment, the offset adjustment value is obtained by performing a calibration procedure to determine the offset adjustment value empirically. For example, a known value of an input signal $V_{IN}$ may be provided to an ADC having a track/hold circuit such as ADC 100 (FIG. 1). Various offset adjustment values may be added to the output signal of the track/hold circuit to identify an offset adjustment value that causes the ADC to output a digital signal that most closely represents the known input voltage.

At a block 203, the ADC enters a track mode in which the ADC tracks the voltage level of the input signal $V_{IN}$. For example, in one embodiment, the ADC includes a track/hold circuit such as track/hold circuit 103 (FIG. 1), which provides an output signal having a voltage level that follows the voltage level of input signal $V_{IN}$. In one such embodiment, via a buffer, the input signal $V_{IN}$ is used to charge a capacitor (not shown) during the track mode so that the capacitor voltage is substantially equal to the voltage of signal $V_{IN}$.

At a block 205, the ADC transitions to a hold mode in which the ADC holds the voltage level of input signal $V_{IN}$ at the time of the transition to the hold mode. For example, in one embodiment, the aforementioned track/hold circuit in effect stops receiving the input signal $V_{IN}$ and, substantially concurrently, holds the voltage level of its output signal at the level it had at the time the track/hold circuit stopped receiving the input signal $V_{IN}$. Continuing the example of block 203, a switch (not shown) used to propagate the input signal $V_{IN}$ to the capacitor is opened during the transition from the track mode to the hold mode, thereby isolating the capacitor from the input signal $V_{IN}$. Thus, the capacitor voltage is substantially equal to the voltage of input signal $V_{IN}$ at the time the switch was opened.

At a block 207, the offset adjustment value obtained at block 201 is added with the voltage held at block 205 during the hold mode. In one embodiment, an offset adjustment generator such as offset adjustment generator 105 (FIG. 1) generates an offset adjustment signal having the value obtained at block 201. This offset adjustment signal is then effectively added to the held value. Continuing the example of block 205, in one embodiment the voltage of the offset adjustment signal is effectively added to the capacitor voltage (i.e., the held value in this embodiment) via a capacitive divider circuit (not shown). The resulting combined signal can then be provided to pre-amp and encoder stages such as stages 107 and 109 (FIG. 1), which can then generate a digital signal representing the voltage level of the combined signal.

At a block 209, the offset adjustment signal is removed from the held voltage during a transition back to the track mode. In one embodiment, the electrical point at which the offset adjustment signal is added to the held voltage is shorted to ground to remove the offset adjustment signal. Continuing the example of block 207, the aforementioned switch (not shown) used to propagate the input signal $V_{IN}$ to the capacitor is closed during the transition from the hold mode to the track mode. Operational flow 200 can then return to block 203 to track the input signal $V_{IN}$ again.

Although operational flow 200 is illustrated and described sequentially in a particular order, in other embodiments, the operations described in the blocks may be performed in different orders, multiple times, and/or in parallel. Further, one or more operations described in the blocks may be omitted or combined in some embodiments.

Figure 3:
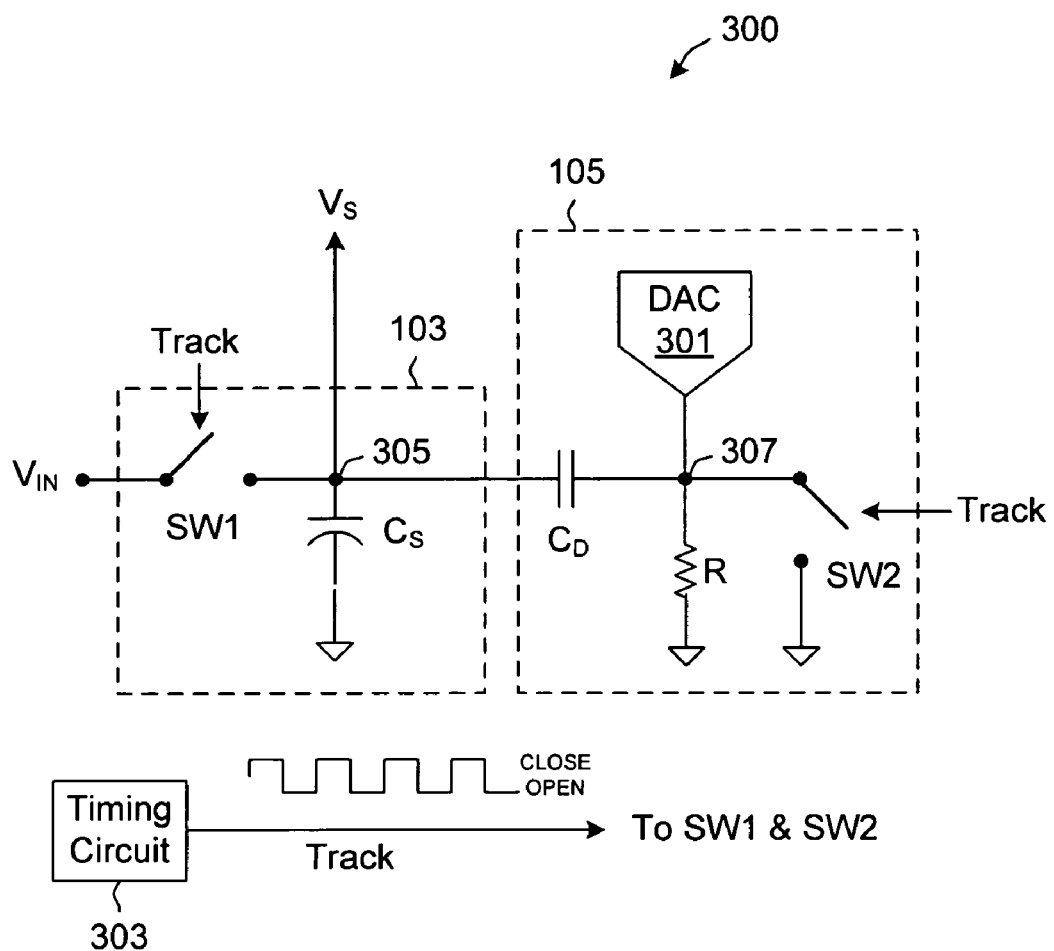
FIG. 3 is a schematic diagram illustrating a portion of an ADC with offset adjustment, according to one embodiment.

FIG. 3 schematically illustrates a portion of an ADC 300 with offset adjustment, according to one embodiment. In this embodiment, ADC 300 is a single-ended ADC and includes embodiments of track/hold circuit 103 and offset adjustment generator 105 (FIG. 1). In particular, this embodiment of track/hold circuit 103 includes a switch SW1 and a sampling capacitor $C_S$. This embodiment of offset adjustment generator 105 includes a switch SW2, a resistor R, a capacitor $C_D$, and a digital-to-analog converter (DAC) 301 that outputs a current having a magnitude controlled by a digital input signal. In some embodiments, capacitors $C_S$ and $C_D$ are implemented with linear capacitors such as, for example, metal—metal inter-digitated capacitors. In other embodiments, capacitor $C_D$ and/or $C_S$ can be implemented using parasitic capacitance formed by conductive lines in the circuit. In some embodiments, resistor R is implemented with a linear resistor that is sized so as to limit self-heating. Still further, in some embodiments switches SW1 and SW2 are implemented using constant gate-source voltage (Vgs) MOS devices.

In addition, this embodiment of ADC 300 includes a timing circuit 303 used to generate a track signal that controls switches SW1 and SW2. In this example, the track signal is a square wave signal having a frequency that is equal to the sampling frequency of ADC 300 in non-interleaved embodiments and equal to one-half of the sampling frequency in interleave-by-two embodiments. In this embodiment, the track signal is an active high signal so that ADC 300 is in the track mode when the track signal is at a logic high level and in the hold mode when the track signal is at a logic low level.

In this embodiment, one terminal of switch SW1 is connected to receive the input signal $V_{IN}$. In some embodiments, a buffer (not shown) is connected to receive input signal $V_{IN}$ and output the buffered input signal to switch SW1. Another terminal of switch SW1 is connected to a first node 305, which is also connected to an electrode of sampling capacitor $C_S$ and to an electrode of capacitor $C_D$. The other electrodes of capacitors $C_S$ and CD are connected to ground and a second node 307, respectively. Second node 307 is also connected to ground through resistor R. DAC 301 is connected to provide an adjustable current to second node 307 (i.e., the common node of capacitor $C_D$ and resistor R). Switch SW2 is connected to resistor R so that resistor R is shorted to ground when switch SW2 is closed. The control terminals of switches SW1 and SW2 are connected to receive the track signal from timing circuit 303.

In operation during the track mode (i.e., the track signal is at a logic high level), switches SW1 and SW2 are closed, thereby allowing the input signal $V_{IN}$ to propagate to first node 305 and shorting out resistor R. Input signal $V_{IN}$ then charges/discharges capacitors $C_S$ and $C_D$ so that the voltage at first node 305 (denoted voltage $V_S$) is substantially equal the voltage of input signal $V_{IN}$. That is, in this embodiment, switch SW1 and capacitors $C_S$ and $C_D$ operate in a way substantially similar to a conventional track/hold circuit that has a switch and a single capacitor (having an equivalent capacitance equal to the sum of the capacitances of capacitors $C_S$ and $C_D$). During the track mode, voltage $V_S$ tracks the voltage of input signal $V_{IN}$.

At the high-to-low transition of the track signal, ADC 300 enters the hold mode. More particularly, in this embodiment, the transition of the track signal causes switches SW1 and SW2 to open, thereby isolating first node 305 from input signal $V_{IN}$ and allowing current from DAC 301 to flow through resistor R. In one embodiment, switch SW1 is opened slightly before switch SW2 to help prevent charge redistribution on the capacitors from affecting the input signal $V_{IN}$.

In some embodiments, DAC 301 can be configured to output a current of magnitude $I_{OFFSET}$ so as to compensate for offset(s) in other component(s) of ADC 300 and/or component(s) in the signal path from the source (e.g., a sensor or transducer) of input signal $V_{IN}$ to ADC 300. The current flow through resistor R causes the voltage at second node 307 to have a level equal to $R(I_{OFFSET})$, where R is the resistance of resistor R. This change in voltage level at second node 307 causes charge to redistribute between capacitors $C_S$ and $C_D$, thereby changing the voltage level at first node 305. The change in voltage (i.e., $\Delta V$) at first node 305 can be defined as equation 1 below:

$$\Delta V = R I_{OFFSET} C_D / (C_D + C_S) \qquad (1)$$

where $C_D$ and $C_S$ are the capacitances of capacitors $C_D$ and $C_S$, respectively. Thus, the resulting voltage at node 305 is $V_S + \Delta V$, where voltage $V_S$ is the held voltage at node 305 before the charge redistribution and $\Delta V$ is as defined in equation 1. In this implementation, $\Delta V$ is independent of $V_S$, which can help ensure that the offset adjustment will be advantageously constant across the expected voltage range of input signal $V_{IN}$.

Figure 4:
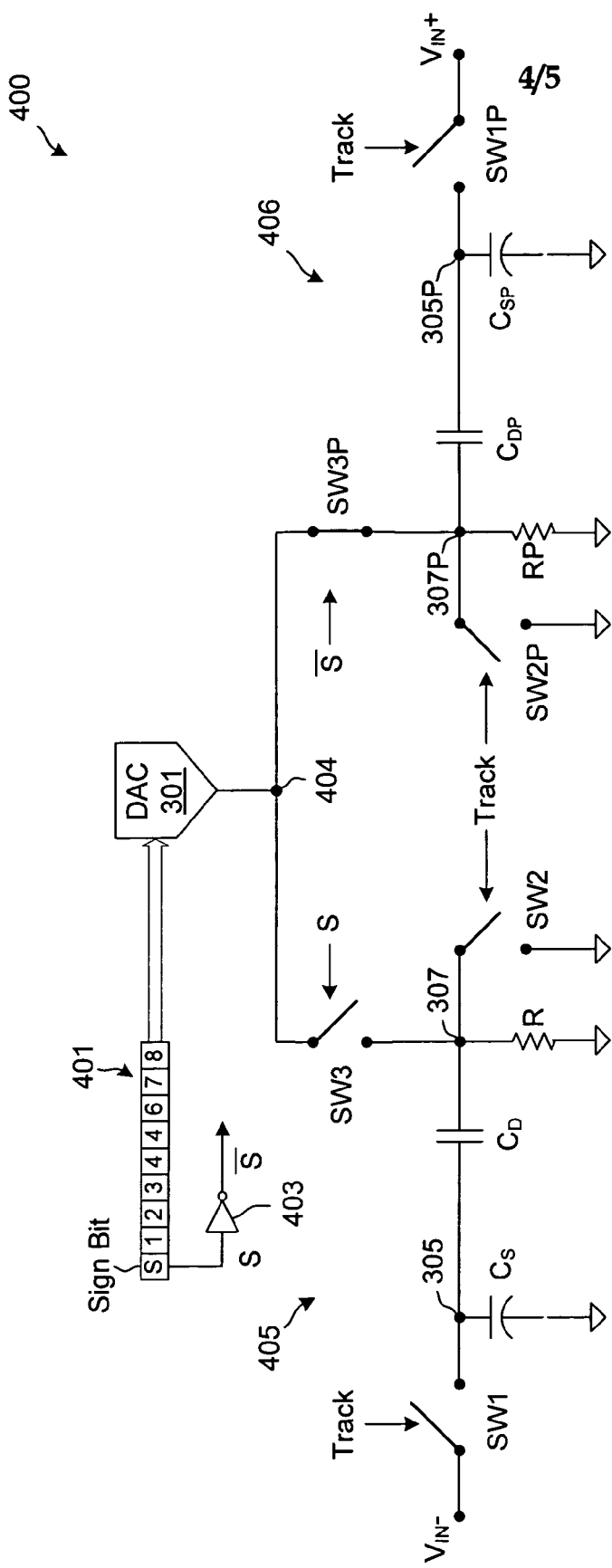
FIG. 4 is a schematic diagram illustrating a portion of a differential-input ADC with offset adjustment, according to one embodiment.

FIG. 4 schematically illustrates a portion of a differential-input ADC 400 with offset adjustment, according to one embodiment. In this embodiment, ADC 400 includes a latch 401 that is used to store values for a sign signal S and an eight-bit value to set the magnitude $I_{OFFSET}$ of the current from DAC 301. An inverter 403 is used to generate the complement of sign signal S. In this embodiment, sign signal S is used to control switch SW3 and the complement of sign signal S is used to control a switch SW3P (described below). Thus, switch SW3 will be closed when switch SW3P is opened, and vice versa. In this embodiment, switches SW3 and SW3P are each connected to DAC 301 via a third node 404.

ADC 400 includes the portion of ADC 300 shown in FIG. 3, except with a switch SW3 inserted between second node 307 and DAC 301. This portion serves as an offset adjustment unit for the negative input terminal (i.e., a negative offset adjustment unit 405) of differential-input ADC 400. Thus, in this embodiment, switch SW1 is connected to receive the negative component signal (i.e., $V_{IN}-$) of the differential input signal. Consequently, the negative offset adjustment unit 405 operates as described above in conjunction with FIG. 3 when the current from DAC 301 is steered to resistor R via switch SW3 (i.e., when sign signal S is at a logic high level).

Conversely, when switch SW3 is opened (i.e., when sign signal S is at a logic low level), the voltage level at second node 307 remains substantially constant whether switch SW2 opens or closes. Therefore, when switch SW3 is opened, there is effectively no offset adjustment at node 305 during the hold mode.

In addition, ADC 400 includes an offset adjustment unit for the positive input terminal (i.e., a positive offset adjustment unit 406). This positive offset adjustment unit 406 includes a switch SW1P, a sampling capacitor $C_{SP}$, a switch SW2P, a resistor RP, a capacitor $C_{DP}$ and switch SW3P, respectively corresponding to aforementioned switch SW1, capacitor $C_S$, switch SW2, resistor R, capacitor $C_D$ and switch SW3 of the negative offset adjustment unit 405. In this embodiment, switch SW1P is connected to receive the positive component signal (i.e., $V_{IN}+$) of the differential input signal. This positive offset adjustment unit 406 operates in substantially the same manner as described for the negative offset adjustment unit 405 (see FIG. 3) when the current from DAC 301 is steered to resistor RP via switch SW3P (i.e., when sign signal S is at a logic low level). Conversely, when switch SW3P is opened (i.e., when the sign signal S is at a logic high level), the voltage level at second node 307P remains substantially constant whether switch SW2P opens or closes. Therefore, when switch SW3P is opened, there is effectively no offset adjustment at first node 305P during the hold mode. Thus, the offset adjustment for this differential embodiment is bidirectional.

Figure 5:
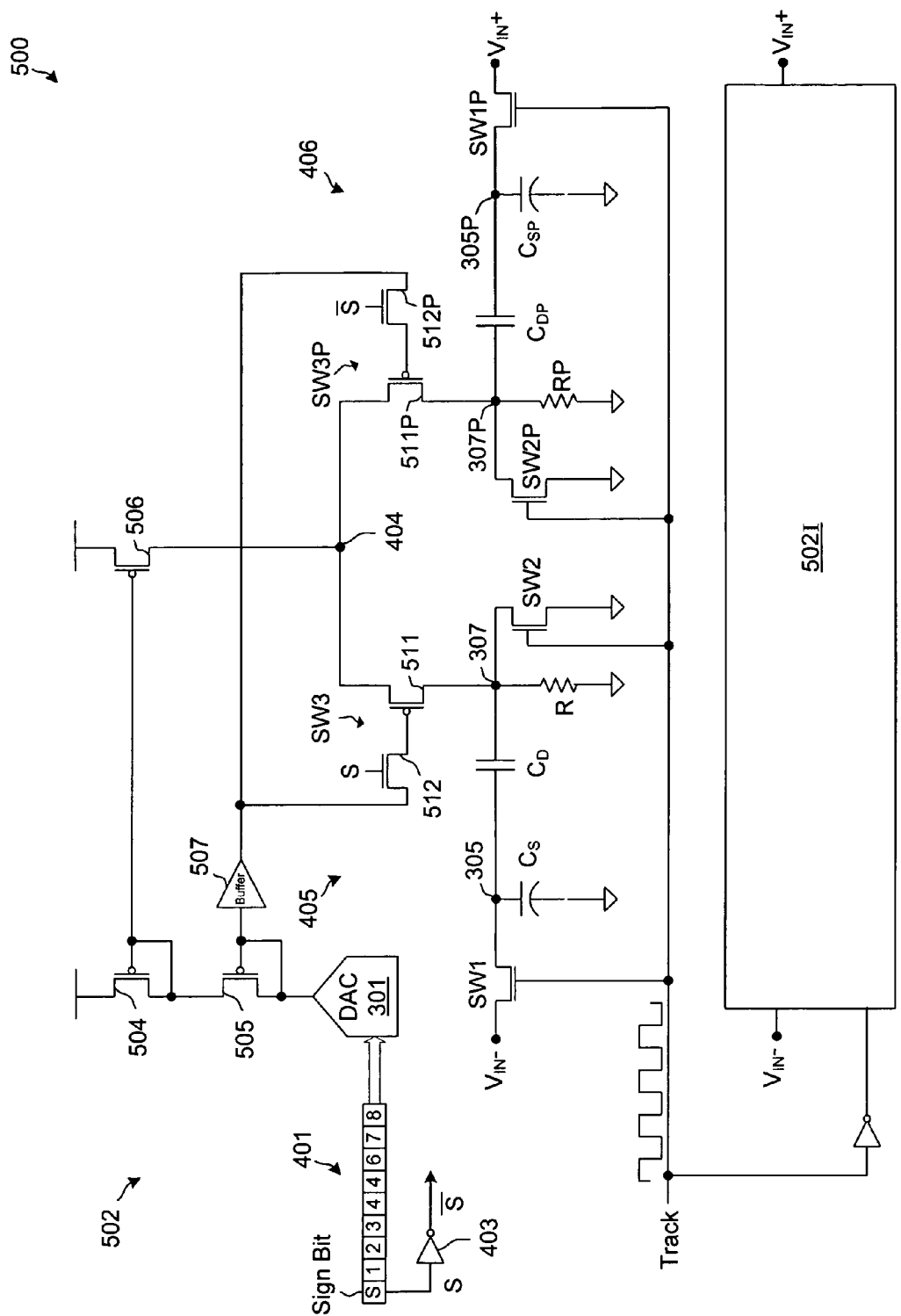
FIG. 5 is a more detailed schematic diagram illustrating a portion of a differential-input ADC, according to one embodiment.

FIG. 5 schematically illustrates a portion of an interleaved differential-input ADC 500, according to one embodiment. In this embodiment, ADC 500 includes a first ADC subunit 502 that is substantially the same as ADC 400 (FIG. 4) except for the addition of a current mirror. In addition, FIG. 5 shows implementations for the switches SW1–SW3 and SW1P–SW3P.

In addition, ADC 500 includes an interleaved ADC subunit 502I, which is substantially similar to ADC subunit 502, except that in this embodiment interleaved ADC subunit 502I uses the complement of the track signal so that it enters the track and hold modes substantially 180° out of phase with ADC subunit 502. In addition, in this embodiment, subunits 502 and 502I share nodes for receiving component differential signals $V_{IN}-$ and $V_{IN}+$. Together, ADC subunits 502 and 502I allow ADC 500 to have an effective sampling rate twice the frequency of the track signal.

In this embodiment, switches SW1, SW2, SW1P and SW2P are implemented using N-channel transistors. DAC 301 is connected to drive a current through series connected diodes implemented by diode connected P-channel transistors 504 and 505. The current through diode-connected P-channel transistor 504 is mirrored in P-channel transistor 506, which serves as a current source for negative and positive offset adjustment units of ADC subunit 502.

Switches SW3 and SW3P are implemented using a pair of source-coupled P-channel transistors 511 and 511P, respectively. The gates of P-channel transistors 511 and 511P are coupled to the drains of N-channel transistors 512 and 512P, respectively. The gates of N-channel transistors 512 and 512P are connected to receive sign signal S and the complement of sign signal S, respectively from latch 401. The sources of N-channel transistors 512 and 512P are connected to an output terminal of a buffer 507. The input terminal of buffer 507 is connected to the output terminal of DAC 502 in this embodiment. In some embodiments, additional switches may be connected to the gates of P-channel transistors 511 and 511P to prevent the gate voltages from floating when N-channel transistor 512 or 512P is turned off.

In operation, buffer 507 drives the sources of N-channel transistors 512 and 512P to a voltage that is two diode drops below the supply voltage. Thus, when sign signal S is at a logic high level, N-channel transistor 512 turns on while N-channel transistor 512P turns off, thereby steering the current from current source P-channel transistor 506 to the negative offset adjustment unit 405. The negative offset adjustment unit 405 will then operate as described above in response to the track signal. That is, when the track signal is at a logic high level, the N-channel transistors implementing switches SW1 and SW2 will turn on, allowing the input signal $V_{IN}-$ to propagate to charge capacitors $C_S$ and $C_D$. When the track signal transitions to a logic low level, the N-channel transistors implementing switches SW1 and SW2 will turn off, isolating capacitors $C_S$ and $C_D$ from the input signal $V_{IN}-$ and allowing the current of magnitude $I_{OFFSET}$ from current source P-channel transistor 506 to flow through resistor R (and thereby generate an offset adjustment signal to be added to the voltage at first node 305).

Conversely, when sign signal S is at a logic low level, N-channel transistor 512P turns on while N-channel transistor 512 turns off, thereby steering the current from current source P-channel transistor 506 to the positive offset adjustment unit 406. The positive offset adjustment unit 406 will then operate as previously described in response to the track signal. That is, when the track signal is at a logic high level, the N-channel transistors implementing switches SW1P and SW2P will turn on, allowing the input signal $V_{IN}+$ to propagate to charge capacitors $C_{SP}$ and $C_{DP}$. When the track signal transitions to a logic low level, the N-channel transistors implementing switches SW1P and SW2P will turn off, isolating capacitors $C_{SP}$ and $C_{DP}$ from the input signal $V_{IN}+$ and allowing the current of magnitude $I_{OFFSET}$ from current source P-channel transistor 506 to flow through resistor RP (and thereby generate an offset adjustment signal to be added to the voltage at first node 305P).

Reference has been made throughout this specification to "one embodiment," "an embodiment," or "an example embodiment" meaning that a particular described feature, structure, or characteristic is included in at least one embodiment of the present invention. Thus, usage of such phrases may refer to more than just one embodiment. Furthermore, the described features, structures, or characteristics may be combined in any suitable manner in one or more embodiments.

One skilled in the relevant art may recognize, however, that the invention may be practiced without one or more of the specific details, or with other methods, resources, materials, etc. In other instances, well known structures, resources, or operations have not been shown or described in detail merely to avoid obscuring aspects of the invention.

In addition, embodiments of the present invention may be implemented not only with physical components (e.g., within a semiconductor chip), but also within machine-readable media. For example, the designs described above may be stored upon and/or embedded with machine readable media associated with a design tool used for designing semiconductor devices. Examples include designs defined/formatted in VHSIC Hardware Description Language (VHDL), Verilog language and SPICE language. Some netlist examples include: a behavior level netlist, a register transfer level (RTL) netlist, a gate level netlist, and a transistor level netlist. Machine readable media also include media having layout information such as a GDS-II file. Further, netlist files or other machine-readable media for semiconductor chip design may be used in a simulation to perform the methods of the embodiments disclosed herein.

Thus, embodiments of the present invention may be used as or to support a software program executed upon some form of processing core (e.g., a CPU of a computer) or otherwise implemented or realized upon or within a machine-readable medium. A machine-readable medium includes any mechanism for storing or transmitting information in a form readable by a machine (e.g. a computer). For example, a machine-readable medium can include read only memory (ROM), random access memory (RAM), magnetic disk storage media, optical storage media, flash memory devices, etc. In addition, machine-readable media can include propagated signals such as electrical, optical, acoustical or other form of propagated signal (e.g., carrier wave signals, infrared signals, digital signals, etc.)

While example embodiments and applications have been illustrated and described, it is to be understood that the invention is not limited to the precise configuration and resources described above. Various modifications, changes, and variations apparent to those skilled in the art may be made in the arrangement, operation, and details of the methods and systems of the present invention disclosed herein without departing from the scope of the claimed invention.

What is claimed is:

1. A circuit, comprising:
   a first capacitor having a first electrode;
   a first switch to selectively propagate an input signal to the first electrode of the first capacitor during a track mode and to not propagate the input signal to the first electrode of the first capacitor during a hold mode; and
   an offset adjustment generator coupled to the first electrode of the first capacitor, wherein the offset adjustment generator is to selectively provide an offset adjustment signal to the first electrode of the first capacitor during the hold mode and not provide the offset adjustment signal to the electrode of the first capacitor during the track mode.

2. The circuit of claim 1 wherein the offset adjustment generator comprises:
   a second capacitor having a first electrode coupled to the first electrode of the first capacitor; and
   a voltage source coupled to a second electrode of the second capacitor, wherein the voltage source is to selectively impress a voltage at the second electrode of the second capacitor during the hold mode and not impress the voltage at the second electrode of the second capacitor during the track mode.

3. The circuit of claim 2 wherein the voltage source comprises:
   a current source to selectively provide a current;
   a resistor coupled to receive the current from the current source; and
   a second switch to selectively short circuit the resistor during the track mode and not short circuit the resistor during the hold mode.

4. The circuit of claim 3 wherein the current source is adjustable.

5. The circuit of claim 3 wherein the current source comprises a digital to analog converter (DAC).

6. The circuit of claim 2 wherein the first capacitor is implemented with parasitic capacitance of a conductor connecting the second capacitor to the first switch.

7. The circuit of claim 1 further comprising an encoder stage coupled to the first electrode of the first capacitor, wherein during the hold mode the encoder stage is to selectively generate a digital representation of a voltage level at the first electrode of the first capacitor.

8. The circuit of claim 1 wherein the input signal is a component signal of a differential signal.

9. A method for adjusting an offset of a track/hold circuit, the method comprising:
   causing a signal level at a first node of the track/hold circuit to track a signal level of an input signal daring a track mode;
   generating an offset adjustment signal;
   combining the offset adjustment signal at the first node of the track/hold circuit during a hold mode; and
   causing the offset adjustment signal to not be combined at the first node of the track/hold circuit during the track mode.

10. The method of claim 9 wherein causing the signal level at the first node of the track/hold circuit comprises selectively causing the input signal to propagate to the first node of the track/hold circuit during the track mode and preventing the input signal from propagating to the first node of the track/hold circuit during the hold mode.

11. The method of claim 9 wherein generating the offset adjustment signal comprises selectively generating a voltage that is impressed at a second node of the track/hold circuit, wherein the second node of the track/hold circuit is coupled to the first node of the track/hold circuit via a capacitance.

12. The method of claim 11 wherein selectively generating the voltage comprises selectively propagating a current from a current source through a resistance that has an electrode coupled to the second node of the track/hold circuit during the hold mode and not propagating the current through the resistance during the track mode.

13. The method of claim 12 wherein selectively generating the voltage further comprising short-circuiting the resistance during the track mode.

14. The method of claim 9 wherein the input signal is a component signal of a differential signal.

15. A circuit, comprising:
   means for selectively causing a signal level at a first node of the circuit to track a signal level of an input signal during a track mode;
   means for selectively generating an offset adjustment signal; and
   means for selectively combining the offset adjustment signal at the first node of the circuit during a hold mode and causing the offset adjustment signal to not be combined at the first node of the circuit during the track mode.

16. The circuit of claim 15 wherein the means for selectively causing the signal level at the first node of the circuit further comprises means for selectively causing the input signal to propagate to the first node of the circuit during the track mode and preventing the input signal from propagating to the first node of the circuit during the hold mode.

17. The circuit of claim 16 wherein the means for generating the offset adjustment signal further comprises means for selectively impressing a voltage at a second node of the circuit, wherein the second node of the circuit is coupled to the first node of the circuit via a capacitance.

18. The circuit of claim 17 wherein the means for selectively impressing the voltage further comprises means for selectively propagating a current through a resistance coupled to the second node of the circuit during the hold mode and not propagating the current through the resistance during the track mode.

19. The circuit of claim 18 wherein the means for selectively generating the voltage further comprises means for selectively short-circuiting the resistance during the track mode.

20. The circuit of claim 15 wherein the input signal is a component signal of a differential signal.

* * * * *

UNITED STATES PATENT AND TRADEMARK OFFICE
CERTIFICATE OF CORRECTION

PATENT NO. : 7,136,000 B1
APPLICATION NO. : 11/156057
DATED : November 14, 2006
INVENTOR(S) : Ols Hidri et al.

Page 1 of 1

It is certified that error appears in the above-identified patent and that said Letters Patent is hereby corrected as shown below:

Colum 6, Line 12: "5021 share nodes" should read -- 502I share nodes --

Colum 6, Line 14: "5021 share nodes" should read -- 502I share nodes --

Colum 6, Line 17: "5021 share nodes" should read -- 502I share nodes --

Signed and Sealed this

Thirteenth Day of March, 2007

JON W. DUDAS
*Director of the United States Patent and Trademark Office*